US007867898B2

(12) United States Patent
Kim et al.

(10) Patent No.: US 7,867,898 B2
(45) Date of Patent: Jan. 11, 2011

(54) METHOD FORMING OHMIC CONTACT LAYER AND METAL WIRING IN SEMICONDUCTOR DEVICE

(75) Inventors: Dae-Yong Kim, Gyeonggi-do (KR); Jong-Ho Yun, Gyeonggi-do (KR); Hyun-Su Kim, Gyeonggi-do (KR); Eun-Ji Jung, Gyeonggi-do (KR); Eun-Ok Lee, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 221 days.

(21) Appl. No.: 11/772,953

(22) Filed: Jul. 3, 2007

(65) Prior Publication Data
US 2008/0124921 A1 May 29, 2008

(30) Foreign Application Priority Data
Jul. 6, 2006 (KR) ...................... 10-2006-0063426

(51) Int. Cl.
*H01L 21/44* (2006.01)
(52) U.S. Cl. .................. 438/655; 438/637; 438/618; 438/648; 438/656; 257/E21.586
(58) Field of Classification Search ................. 438/637, 438/618, 648, 655, 656; 257/E21.586
See application file for complete search history.

(56) References Cited

U.S. PATENT DOCUMENTS

| 2002/0019127 | A1* | 2/2002 | Givens | 438/637 |
| 2003/0124826 | A1* | 7/2003 | Kim | 438/592 |
| 2003/0189026 | A1* | 10/2003 | Padhi et al. | 216/89 |
| 2006/0251801 | A1* | 11/2006 | Weidman et al. | 427/99.5 |
| 2007/0210448 | A1* | 9/2007 | Wong et al. | 257/734 |
| 2007/0287237 | A1* | 12/2007 | Rockenberger et al. | 438/163 |
| 2009/0004851 | A1* | 1/2009 | Shue et al. | 438/660 |

FOREIGN PATENT DOCUMENTS

| JP | 06310608 | 11/1994 |
| JP | 09082805 | 3/1997 |
| JP | 2003332264 | 11/2003 |
| KR | 1999006145 | 1/1999 |
| KR | 1020040108222 A | 12/2004 |
| KR | 1020050064787 A | 6/2005 |

* cited by examiner

*Primary Examiner*—Matthew S Smith
*Assistant Examiner*—John M Parker
(74) *Attorney, Agent, or Firm*—Volentine & Whitt, PLLC

(57) ABSTRACT

A method of forming an ohmic contact layer including forming an insulation layer pattern on a substrate, the insulation pattern layer having an opening selectively exposing a silicon bearing layer, forming a metal layer on the exposed silicon bearing layer using an electrode-less plating process, and forming a metal silicide layer from the silicon bearing layer and the metal layer using a silicidation process. Also, a method of forming metal wiring in a semiconductor device using the foregoing method of forming an ohmic contact layer.

20 Claims, 7 Drawing Sheets

METHOD FORMING OHMIC CONTACT LAYER AND METAL WIRING IN SEMICONDUCTOR DEVICE

CROSS-REFERENCE TO RELATED APPLICATIONS

This application claims priority under 35 USC §119 to Korean Patent Application No. 2006-63426 filed on Jul. 6, 2006, the subject matter of which is hereby incorporated by reference.

BACKGROUND OF THE INVENTION

1. Field of the Invention

The present invention relates to a method of forming an ohmic contact layer and a method of forming a metal wiring in a semiconductor device using the ohmic contact layer. More particularly, the invention relates to a method of forming an ohmic contact layer using an electrode-less plating process and a method of forming metal wiring in a semiconductor device using the ohmic contact layer.

2. Description of Related Art

As contemporary semiconductor devices become more highly integrated their constituent components are reduced in size. This is true for the gate electrodes and source/drain regions forming a transistor. Unfortunately, as the channel length separating source/drain regions decreases to match the reduced line width of the transistor's gate electrode, the performance characteristics of the transistor begin to degrade.

As constituent components shrink in size, the properties of various materials once used to form the components must be re-evaluated. For example, wiring used to connect the source/drain regions of a transistor were formerly made from polysilicon. However, densely integrated semiconductor devices suffer from operating speed issues and excessive power consumption requirements when conventional polysilicon wiring is used due to a corresponding high contact resistance or a high sheet resistance.

In attempts to address this problem, metal wiring has been used as a replacement for polysilicon wiring in contemporary semiconductor devices. Generally speaking, conventional metal wiring includes a tungsten plug and a composite layer including titanium. However, the fabrication processes used to form the titanium composite layer and the tungsten plug must be separately performed and typically require different types of fabrication equipment. This requirement significantly slows fabrication throughput for the semiconductor device. Additionally, undesired impurities may be diffused into the substrate supporting the semiconductor device during the fabrication process used to form the titanium composite layer due to its high processing temperature.

In view of these drawbacks, another method of forming metal wiring has recently been proposed. This method includes forming an ohmic contact layer from tungsten, forming a barrier layer from tungsten nitride, and forming a plug from tungsten. This alternate method offers greater simplicity of implementation over previous approaches to the fabrication of metal wiring.

Figures (FIGS.) 1 and 2 are cross-sectional views illustrating a conventional method of forming metal wiring. FIG. 3 is a scanning electron microscope (SEM) picture showing a cross-sectional view of an overgrown tungsten silicide layer resulting from the conventional method of forming metal wiring.

Referring to FIG. 1, an insulating interlayer layer formed on a substrate 10 is etched to form an insulating interlayer pattern 20 including a contact hole 15 exposing an upper surface of substrate 10.

Referring to FIG. 2, a composite layer 30 is formed with a substantially uniform thickness on the exposed surface of substrate 10 and insulating interlayer pattern 20. More particularly, a tungsten layer 26 and a tungsten nitride layer 28 are successively stacked to form composite layer 30. Then, the remaining portion of contact hole 15 is filled with tungsten to form a tungsten plug 40.

According to this method, composite layer 30, including tungsten layer 26 and tungsten nitride layer 28, and tungsten plug 40 may be formed in situ, and the metal wiring may be formed at a lower temperature than the temperature usually required to form the former titanium composite layer.

However, in the above method, the tungsten layer 26 is commonly formed using a chemical vapor deposition (CVD) process incorporating (e.g.,) tungsten fluorine (WF6) gas. Unfortunately, a tungsten bearing gas may excessively react with the silicon in substrate 10 to form a tungsten silicide layer. For example, FIG. 3 shows an overgrown tungsten silicide layer caused by an excessive reaction of the tungsten in a tungsten bearing gas with silicon.

Additionally, when a titanium nitride layer (not illustrated) is formed as a capping layer before forming tungsten layer 26, the tungsten bearing gas may permeate the capping layer so that a tungsten silicide layer is formed on silicon substrate 10.

SUMMARY OF THE INVENTION

In one embodiment, the invention provides a method of forming an ohmic contact layer comprising; forming an insulation layer pattern on a substrate, the insulation pattern layer having an opening selectively exposing a silicon bearing layer, forming a metal layer on the exposed silicon bearing layer using an electrode-less plating process, and forming a metal silicide layer from the silicon bearing layer and the metal layer using a silicidation process.

In another embodiment, the invention provides a method of forming metal wiring in a semiconductor device, the method comprising; forming a transistor on a substrate, forming an insulation layer pattern having an opening exposing a silicon bearing layer associated with the transistor, forming a metal layer on the exposed silicon bearing layer using an electrode-less plating process, forming a metal silicide layer from the metal layer and the silicon bearing layer using a silicidation process, forming a conductive layer of substantially uniform thickness on the metal silicide layer and the insulation pattern, and forming a metal plug filling the opening.

BRIEF DESCRIPTION OF THE DRAWINGS

Embodiments of the invention will be described with reference to the accompanying drawings, in which.

DESCRIPTION OF THE EMBODIMENTS

Figure 1:
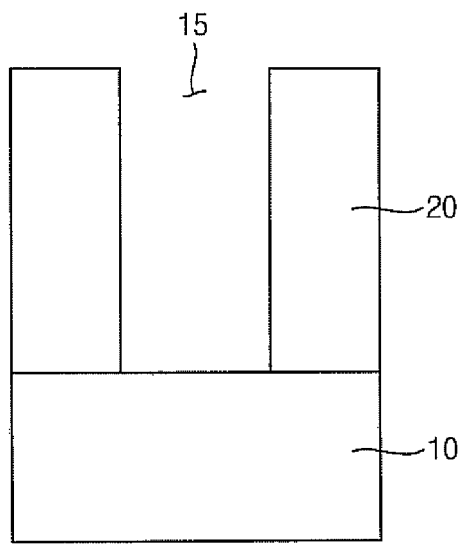
FIGS. 1 and 2 are cross-sectional views illustrating a conventional method of forming a metal wiring.
Figure 2:
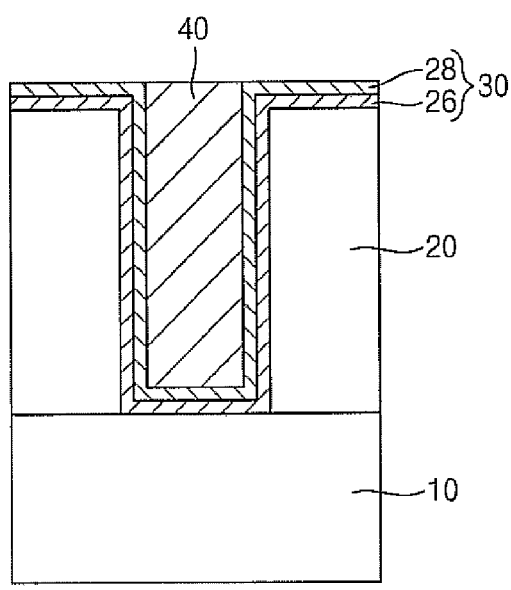
Figure 3:
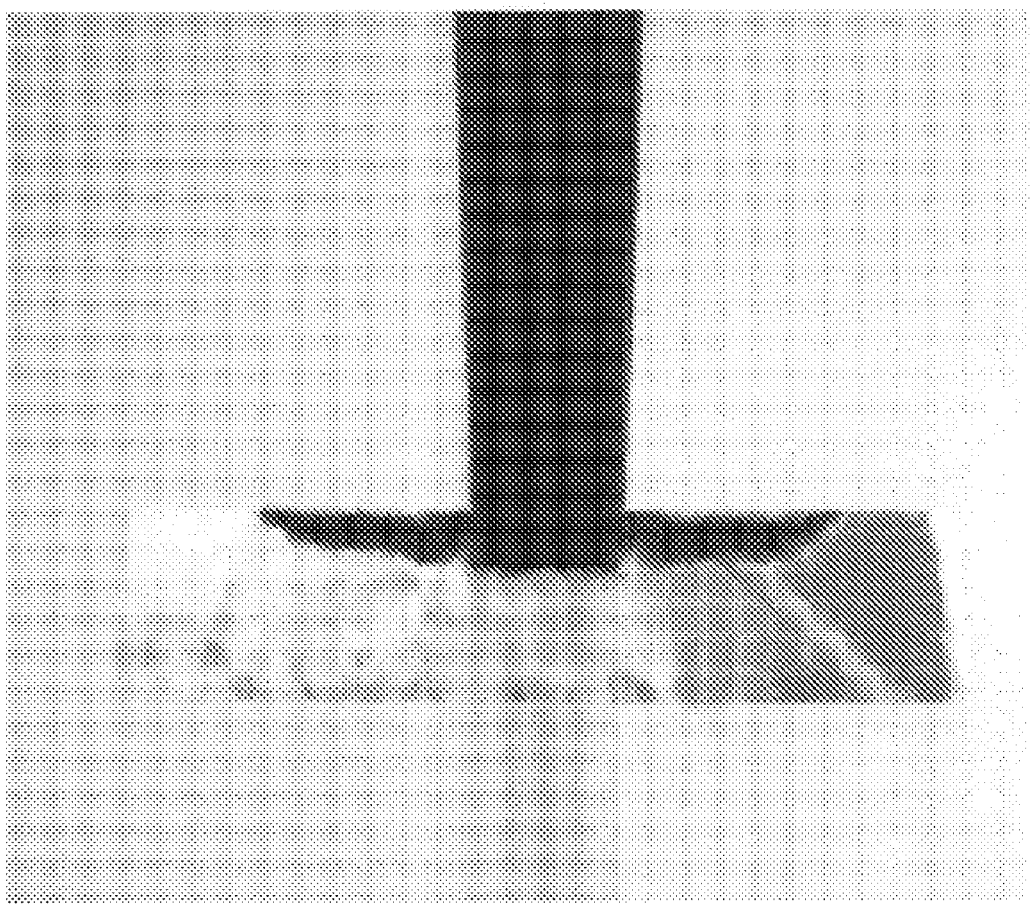
FIG. 3 is a scanning electron microscope (SEM) picture showing a cross-sectional view of an overgrown tungsten silicide layer according to the conventional method of forming the metal wiring.

Embodiments of the invention will be described in some additional detail with reference to the accompanying drawings. This invention may, however, be embodied in many different forms and should not be construed as limited to only the illustrated embodiments. Rather, these embodiments are presented as teaching examples. In the drawings, the relative size and shape of various layers and regions may be exaggerated for clarity of illustration.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 4 through 7 are related cross-sectional views illustrating a method of forming an ohmic contact layer in accordance with embodiments of the invention.

Figure 4:
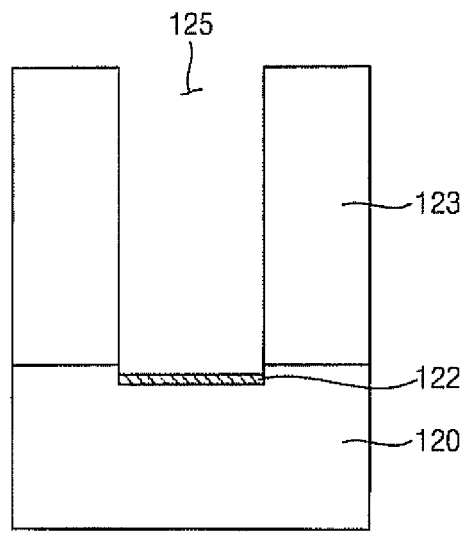
FIGS. 4 to 7 are cross-sectional views illustrating a method of forming an ohmic contact layer in accordance with embodiments of the invention.

Referring to FIG. 4, a substrate 120 includes an insulation layer pattern 123 having an opening 125 exposed an upper surface portion of substrate 120. The material forming substrate 120 includes silicon. For example, substrate 120 may be formed from silicon, silicon-germanium, etc.

Further, the insulation layer from which an insulation layer pattern 123 is formed also includes silicon. For example, the insulation layer may include a silicon oxide layer such as a boron phosphorous silicate glass (BPSG) oxide layer, a phosphorous silicate glass (PSG) oxide layer, a silicon-on-glass (SOG) oxide layer, a high density plasma (HDP) oxide layer, etc. The insulation layer may have a multi-layered structure formed from multiple oxide layers of same or different material composition.

After an etching mask selectively exposing the upper surface of the insulation layer is formed, the exposed portions of the insulation layer may be etched using, for example, a dry-etch process. Thus, opening 125 partially exposes substrate 120 or a silicon bearing layer formed on substrate 120 (hereafter singularly or collectively referred to as "the silicon bearing layer 122") through the insulation layer. When the insulation layer is thus etched, an upper portion of silicon bearing layer 122 may be etched.

Alternatively, an insulation layer may be formed on substrate 120 on which a conductive pattern (not illustrated) is formed. Here again, an etching mask may be used to selectively expose the upper surface of the insulation layer, and the insulation layer may be etched through the etching mask. Thus, opening 125 may be located to expose an upper surface of the conductive pattern formed on substrate 120 through the insulation layer. Thereafter, silicon bearing layer 122 may be formed (e.g., by deposition) on the exposed upper surface of the conductive pattern.

Examples of materials that may be used to form the silicon bearing layer 122 include a silicon layer, a polysilicon layer, a silicon-germanium alloy layer, etc. The silicon bearing layer 122 may also be formed directly from substrate 120, (i.e., a mono-crystalline silicon layer) using an epitaxial growth process, and in some embodiments may merely be an exposed portion of substrate 120.

Figure 5:
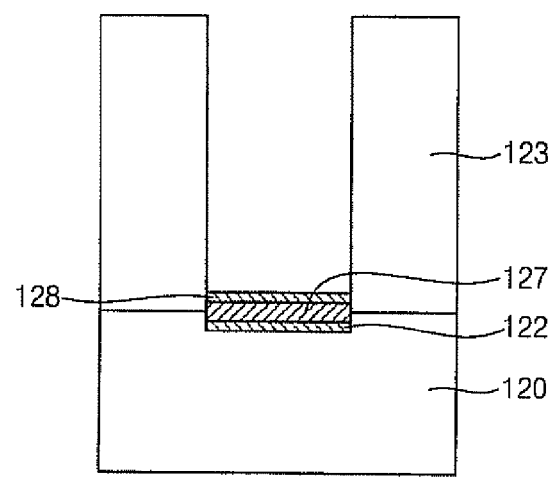

Referring to FIG. 5, a metal layer 127 is then formed on silicon bearing layer 122. The metal layer 127 may include a transition metal, such as tungsten, titanium, nickel, cobalt, etc.

The metal layer 127 may be formed using an electrode-less plating process. Generally, in an electrode-less plating process, metal ions in a metal salt solution are reduced in autocatalysis by a reducing agent so that the metal may be extracted and plated onto an exposed surface. Electrode-less plating processes are distinct from other plating processes which use one or more electrode structures coupled to an electrical source and to reduce metal ions from a metal source and electrically drive the metal ions onto a plating surface.

Accordingly, when the metal layer 127 is formed using an electrode-less plating process, the substrate 120 is immersed in a metal salt solution from which metal ions are generated. The metal salt solution may include a reducing agent such as formaldehyde, hydrazine, etc., and be used to generate transition metal ions. In one embodiment of the invention, the metal salt solution is used to generate cobalt ions. The transition metal ions extracted from the metal salt solution are plated onto the exposed upper surface portion of silicon bearing layer 122. However, the metal is not deposited on exposed surfaces of the insulation layer pattern 123 due to its material nature (e.g., silicon oxide, HDP oxide, etc.). Therefore, metal layer 127 having a dense amorphous structure and a uniform thickness may be formed only on the silicon bearing layer 122. In one embodiment of the invention, metal layer 127 is formed to a thickness ranging from about 20 Å to about 200 Å.

Thus, because the metal layer 127 is formed using an electrode-less plating process instead of (e.g.,) a physical vapor deposition (PVD) process or a chemical vapor deposition (CVD) process, the metal layer 127 is not formed on the sidewalls of insulation pattern 123 exposed by opening 125 or on the upper surface of the insulation pattern 123. As a result, an additional etching process directed to the removal of undesired portions of the formed metal layer need not be performed. Additionally, the subsequently formed tungsten plug may fill a greater portion of contact opening 125 as compared with the conventional processes used to form similar metal wiring and contact plug structures.

A capping layer 128 may optionally be formed on the metal layer 127 before the structure undergoes a silicidation process. In certain embodiments, the capping layer 128 may improve self-alignment characteristics of the metal silicide layer formed by the silicidation process. Additionally, the capping layer 128 may prevent silicon atoms from diffusing outward and the metal layer 127 from being oxidated. In one embodiment of the invention, the capping layer 128 may be formed from titanium nitride. After a metal silicide layer is formed, the capping layer 128 may be removed.

Figure 6:
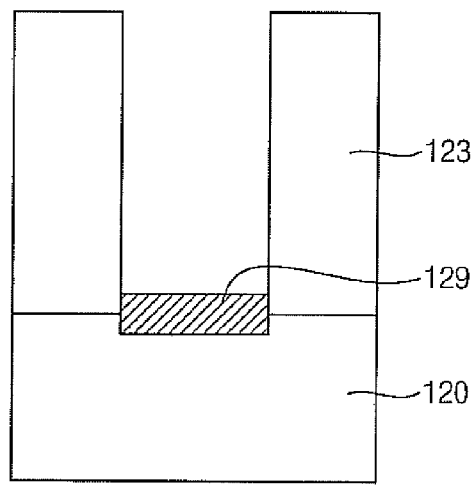

Referring to FIG. 6, the silicon bearing layer 122 and the metal layer 127 are reacted in a silicidation process to form a metal silicide layer 129. Examples of the metal silicide layer 129 may include a cobalt silicide layer, a nickel silicide layer, a titanium silicide layer, etc. In one embodiment of the invention, the metal silicide layer 129 is a cobalt silicide layer.

The metal silicide layer 129 may be formed by a silicidation process in which a single heat treatment is performed on the metal layer 127. Silicon atoms from the silicon bearing layer 122 and metal atoms from the metal layer 127 are reacted to form the metal silicide layer 129. The single heat treatment may be performed at a temperature in a range between about 400° C. and 900° C.

Alternatively, the metal silicide layer 129 may be formed by a silicidation process in which a double heat treatment is performed on metal layer 127. That is, a first heat treatment is performed on metal layer 127 to react silicon bearing layer 122 and metal layer 127 and form a preliminary metal silicide layer. The first heat treatment may be performed at a temperature of about 400° C. to about 500° C.

A second heat treatment is then performed on the preliminary metal silicide layer to form metal silicide layer 129. The second heat treatment may be performed at a temperature of about 700° C. to about 900° C.

An etching process may be additionally performed between the first and the second heat treatments. The etching process may remove remnants of the preliminary metal silicide layer and un-reacted portions of the metal layer 127. An additional cleaning process may be also performed after the first heat treatment or the second heat treatment.

Figure 7:
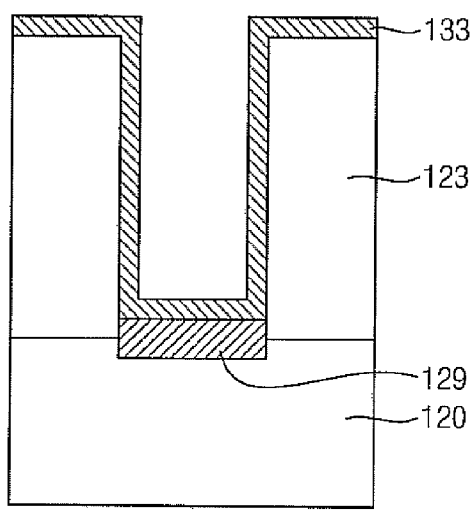

Referring to FIG. 7, a conductive layer 133 of substantially uniform thickness and including tungsten is formed on metal silicide layer 129, as well as the upper and sidewall surfaces of the insulation layer pattern 123. The conductive layer 133 may be formed from tungsten nitride, tungsten, or a composite layer of tungsten/tungsten nitride, etc. When the conductive layer 133 is a composite layer of tungsten and tungsten nitride, the tungsten layer and the tungsten nitride layer may be formed in situ.

FIGS. 8 to 13 are related cross-sectional views illustrating a method of forming a metal wiring in semiconductor device in accordance with embodiments of the invention. Structures formed by the above method of forming the ohmic contact layer, as illustrated with reference to FIGS. 4 to 7, may be employed in the method of forming metal wiring.

Figure 8:
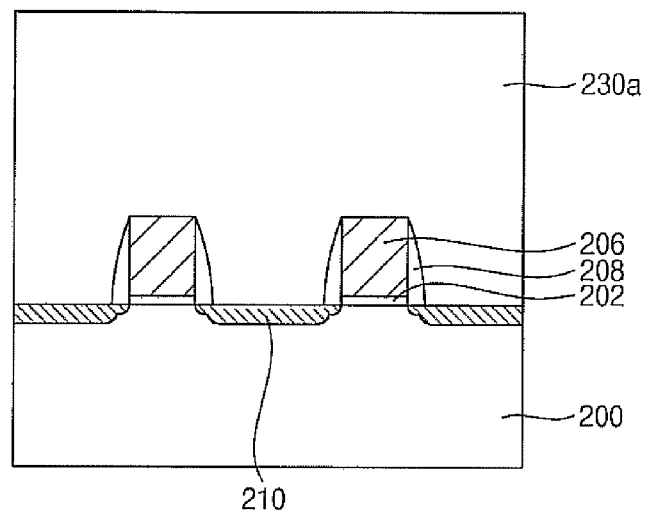
FIGS. 8 to 13 are cross-sectional views illustrating a method of forming a metal wiring in accordance with embodiments of the invention.

Referring to FIG. 8, an insulation layer 230a is formed on a substrate 220 to cover a transistor. The substrate 200 may be formed from a material including silicon. In the illustrated example, the transistor includes a gate insulation layer 202, a gate electrode 206 and an impurity region 210. The gate electrode 206 may include polysilicon doped with impurities. The impurity region 210 may serve as a source/drain region and may be formed by doping impurities into an upper portion of the substrate 200. The transistor also includes a gate spacer 208 formed on a sidewall of the gate electrode 206.

The insulation layer 230a may be formed from a silicon oxide such as a BPSG oxide layer, a PSG oxide layer and an SOG oxide layer, HDP oxide layer, etc. The gate spacer 208 may be formed by a spin coating process or a CVD process. The insulation layer 230a may have a uniform upper surface formed by a conventionally applied planarization process.

Figure 9:
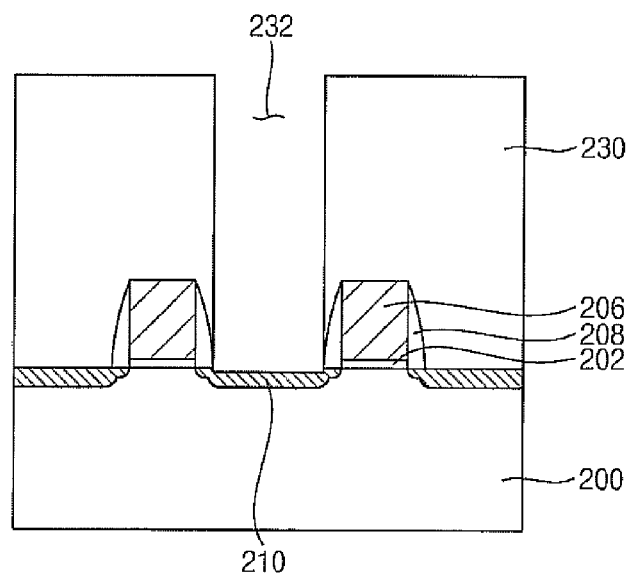

Referring to FIG. 9, the insulation layer 230a is selectively removed (e.g., dry etched through a mask) to form an opening 232 exposing a conductive pattern or region of the transistor. Thus, the insulation layer 230a may be transformed to an insulation layer pattern 230.

In the illustrated example, the conductive pattern/region exposed by the opening 232 is source/drain region 210. However, other patterns or regions, such as gate electrode 206 might be similarly exposed. During formation of the opening 232 through the insulation layer 230a, the upper surface of source/drain region 210 may be etched. In the context of the embodiment described in relation to FIGS. 4-7, source/drain region 210 is the silicon bearing layer.

Figure 10:
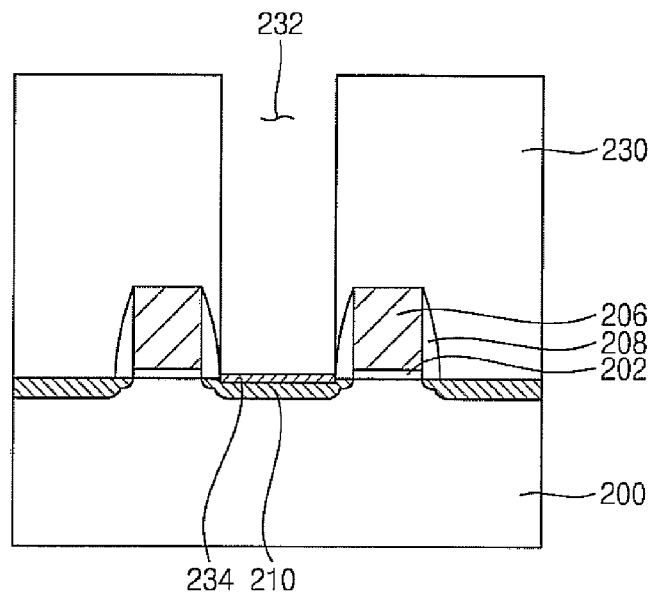

Referring to FIG. 10, a metal layer 234 is formed on the upper surface of source/drain region 210 exposed by the opening 232. The metal layer 234 may include a transition metal layer, such as tungsten, titanium, nickel, cobalt, etc. In one embodiment of the invention, the metal layer 234 may be a cobalt layer.

The metal layer 234 may be formed using an electrode-less plating process. When the electrode-less plating process is performed, the substrate 200 is immersed in a metal salt solution from which metal ions will be generated. In one embodiment of the invention, the metal salt solution generates cobalt ions. The metal salt solution may include a reducing agent such as formaldehyde, hydrazine, etc. Extracted metal ions are plated onto the upper surface of source/drain region 210, but metal is not deposited on insulation layer pattern 230. Therefore, the metal layer 234 may be formed only on source/drain region 210.

Figure 11:
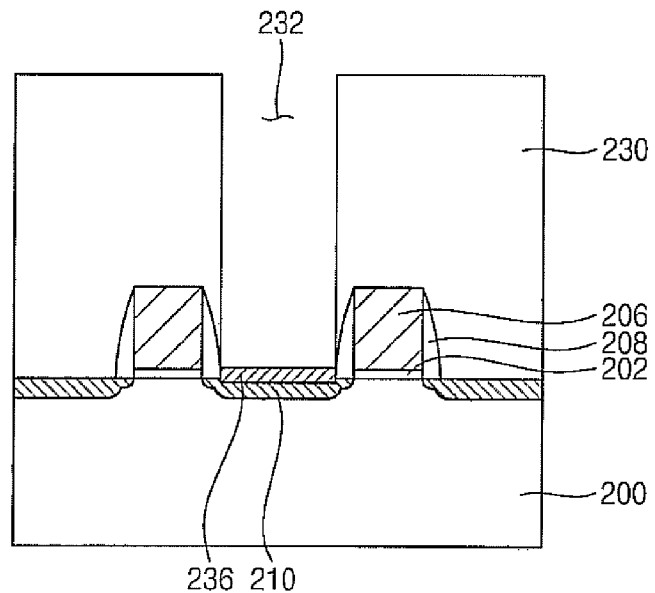

Referring to FIG. 11, the metal layer 234 and the source/drain region 210 are reacted to form a metal silicide layer 236.

In one more specific embodiment of the invention, the metal silicide layer 236 may be formed by a silicidation process in which a single heat treatment is performed on metal layer 234. The single heat treatment may be performed at a temperature of about 400° C. to about 900° C. In another embodiment of the invention, the metal silicide layer 236 may be formed by a silicidation process in which a double heat treatment is performed on metal layer 234. Particularly, a first heat treatment is performed on the metal layer 234 to form a preliminary metal silicide layer at a temperature of about 400° C. to about 500° C. A second heat treatment is then performed on the preliminary metal silicide layer to form the metal silicide layer 236. The second heat treatment may be performed at a temperature of about 700° C. to about 900° C.

Figure 12:
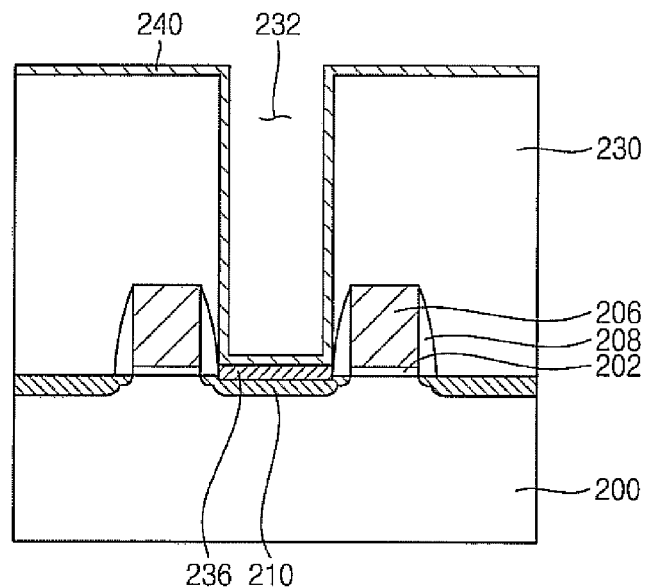

Referring to FIG. 12, a conductive layer 240 including tungsten is formed on the metal silicide layer 236 and on the sidewall and upper surfaces of the insulation layer pattern 230 to a substantially uniform thickness. Conductive layer 240 may include a tungsten nitride layer, a tungsten layer, a composite layer of tungsten/tungsten nitride, etc.

Figure 13:
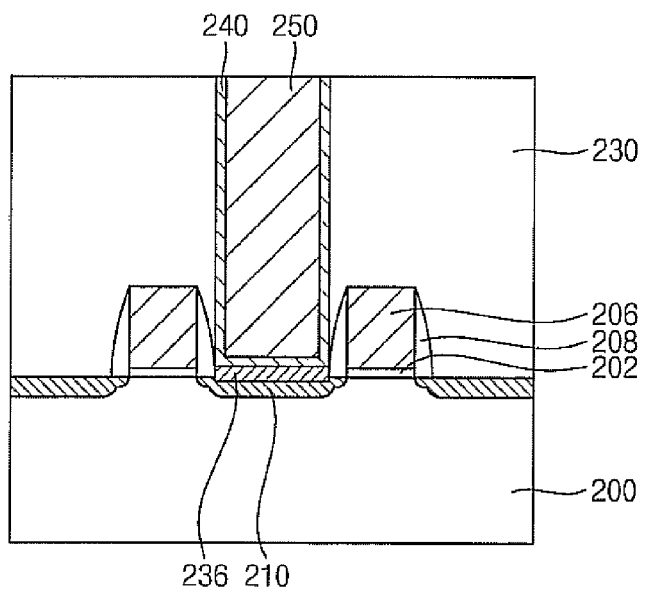

Referring to FIG. 13, a metal plug 250 is now formed on conductive layer 240 to fill the remaining portion of opening 232. Metal plug 250 may be formed from at least one material selected from a group of materials including tantalum (Ta), copper (Cu), tungsten (W), titanium (Ti), and aluminum (Al). In one embodiment of the invention, metal layer 250 is formed from tungsten. The metal layer forming metal plug 250 may be formed using conventionally understood CVD processes, PVD processes, such as a sputtering process, etc.

An upper surface of the metal layer forming metal plug 250 may be planarized by application of a conventional chemical mechanical polishing (CMP) process, an etch back process, or a combination process of CMP and etch back until the upper surface of insulation layer pattern 230 is exposed. Accordingly, metal layer 250, which sufficiently fills opening 232 and electrically connects source/drain region 210 may be formed.

According to embodiments of the invention, a metal silicide layer serving as an ohmic contact layer formed by an electrode-less plating process may be formed with a substantially uniform thickness because the metal layer forming the metal silicide layer is not reacted with silicon outside a defined region of the substrate. Additionally, the metal silicide layer may be formed by a silicidation process in which a single heat treatment is performed so that a throughput for the metal wiring fabrication process is improved.

Furthermore, the metal silicide layer formed by the electrode-less plating process and a metal plug may be formed in situ, and metal included in a metal source gas may be prevented from permeating into the substrate.

The foregoing is illustrative of the present invention and is not to be construed as limiting thereof. Although several embodiments of the invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims.

What is claimed is:

1. A method of forming an ohmic contact layer comprising:
    forming an insulation layer pattern on a substrate, the insulation pattern layer having an opening selectively exposing a silicon bearing layer;
    forming a metal layer on the exposed silicon bearing layer using an electrode-less plating process;
    forming a metal silicide layer from the silicon bearing layer and the metal layer using a silicidation process; and
    forming a conductive layer on the metal silicide layer, wherein the conductive layer comprises a tungsten layer or a composite layer of tungsten and tungsten nitride; and
    wherein the silicidation process comprises:
        performing a first heat treatment to form a preliminary metal silicide layer by reacting the metal layer and the silicon bearing layer;
        removing un-reacted portions of the metal layer; and
        performing a second heat treatment on the preliminary metal silicide layer, and
    wherein prior to performing the first heat treatment, forming a titanium nitride capping layer on the metal layer.

2. The method of claim 1, wherein the silicon bearing layer exposed by the opening comprises a conductive pattern or a conductive region.

3. The method of claim 1,
    wherein the insulation layer pattern is formed from an insulating layer formed on the substrate and comprising first and second insulation layers.

4. The method of claim 1, wherein the silicon bearing layer comprises at least one material selected from a group of materials including silicon, silicon-germanium, and polysilicon.

5. The method of claim 1, wherein the metal layer comprises at least one material selected from a group of materials consisting of cobalt, tungsten, titanium and nickel.

6. The method of claim 1, wherein the silicidation process is performed at a temperature of about 400° C. to 900° C.

7. The method of claim 1, wherein the first heat treatment is performed at a temperature of about 400° C. to 500° C., and the second heat treatment is performed at a temperature of about 700° C. to 900° C.

8. The method of claim 1, further comprising:
    forming a conductive layer on the metal silicide layer.

9. A method of forming metal wiring in a semiconductor device, the method comprising:
    forming a transistor on a substrate;
    forming an insulation layer pattern having an opening exposing a silicon bearing layer associated with the transistor;
    forming a metal layer on the exposed silicon bearing layer using an electrode-less plating process;
    forming a metal silicide layer from the metal layer and the silicon bearing layer using a silicidation process, wherein the silicidation process comprises:
        performing a first heat treatment to form a preliminary silicide layer by reacting the metal layer and the silicon bearing layer at a temperature of about 400° C. to 500° C.;
        removing un-reacted portions of the metal layer; and
        performing a second heat treatment on the preliminary silicide layer at a temperature of about 700° C. to 900° C.;
    forming a conductive layer of substantially uniform thickness on the metal silicide layer and the insulation pattern; and
    forming a metal plug filling the opening.

10. The method of claim 9, wherein the silicon bearing layer forms at least a portion of a polysilicon gate electrode associated with the transistor or a doped source/drain region formed in the substrate and associated with the transistor.

11. The method of claim 9, wherein the electrode-less plating process comprises:
   immersing the substrate in a metal salt solution; and
   extracting metal ions from the metal salt pollution and plating the metal ions onto the silicon bearing layer.

12. The method of claim 9, wherein the silicidation process is performed as a single heat treatment at a temperature of about 400° C. to 900° C.

13. The method of claim 9, wherein the conductive layer comprises tungsten.

14. The method of claim 13, wherein the conductive layer comprises a tungsten layer or a composite layer of tungsten and tungsten nitride.

15. The method of claim 13, wherein the metal plug comprises tungsten.

16. A method of forming an ohmic contact layer comprising:
   forming an insulation layer pattern on a substrate, the insulation pattern layer having an opening selectively exposing a silicon bearing layer;
   forming a metal layer on the exposed silicon bearing layer using an electrode-less plating process;
   forming a metal silicide layer from the silicon bearing layer and the metal layer using a silicidation process, wherein the silicidation process comprises performing a first heat treatment to form a preliminary metal silicide layer by reacting the metal layer and the silicon bearing layer; and
   prior to performing the first heat treatment, forming a titanium nitride capping layer on the metal layer.

17. The method of claim 16, wherein the metal layer comprises a tungsten layer or a composite layer of tungsten and tungsten nitride.

18. The method of claim 16, wherein the silicon bearing layer exposed by the opening comprises a conductive pattern or a conductive region.

19. The method of claim 16, wherein the insulation layer pattern is formed from an insulating layer formed on the substrate and comprising first and second insulation layers.

20. The method of claim 16, wherein the metal layer comprises at least one material selected from a group of materials consisting of cobalt, tungsten, titanium and nickel.

* * * * *